United States Patent
Isobe

(10) Patent No.: US 7,236,409 B2
(45) Date of Patent: Jun. 26, 2007

(54) SEMICONDUCTOR MEMORY DEVICE PROVIDED WITH CONSTANT-CURRENT CIRCUIT HAVING CURRENT TRIMMING FUNCTION

(75) Inventor: Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 11/045,383

(22) Filed: Jan. 31, 2005

(65) Prior Publication Data

US 2005/0207237 A1    Sep. 22, 2005

(30) Foreign Application Priority Data

Mar. 19, 2004   (JP)   ............... 2004-080813

(51) Int. Cl.
*G11C 7/00*   (2006.01)
(52) U.S. Cl. ............... 365/189.11; 365/104; 365/100
(58) Field of Classification Search .......... 365/189.11, 365/194, 189.09, 185.09, 230.01, 104, 100, 365/105
See application file for complete search history.

(56) References Cited

U.S. PATENT DOCUMENTS

| 5,793,674 A | * | 8/1998 | Kubo et al. ............ 365/185.09 |
| 5,808,953 A | * | 9/1998 | Kim et al. ................. 365/226 |
| 6,163,191 A | * | 12/2000 | Miyagi ....................... 327/208 |
| 6,549,154 B2 | | 4/2003 | Isobe et al. |

* cited by examiner

*Primary Examiner*—Son Dinh
*Assistant Examiner*—Dang Nguyen
(74) *Attorney, Agent, or Firm*—Oblon, Spivak, McClelland, Maier & Neustadt, P.C.

(57) ABSTRACT

A semiconductor memory device includes a memory cell unit including at least one semiconductor memory cell, a voltage generating circuit which produces an operating voltage to which reference is made in performing a predetermined operation on the memory cell unit. The device further includes a constant-current circuit capable of a current trimming operation and adapted to supply a constant current to the voltage generating circuit.

16 Claims, 7 Drawing Sheets

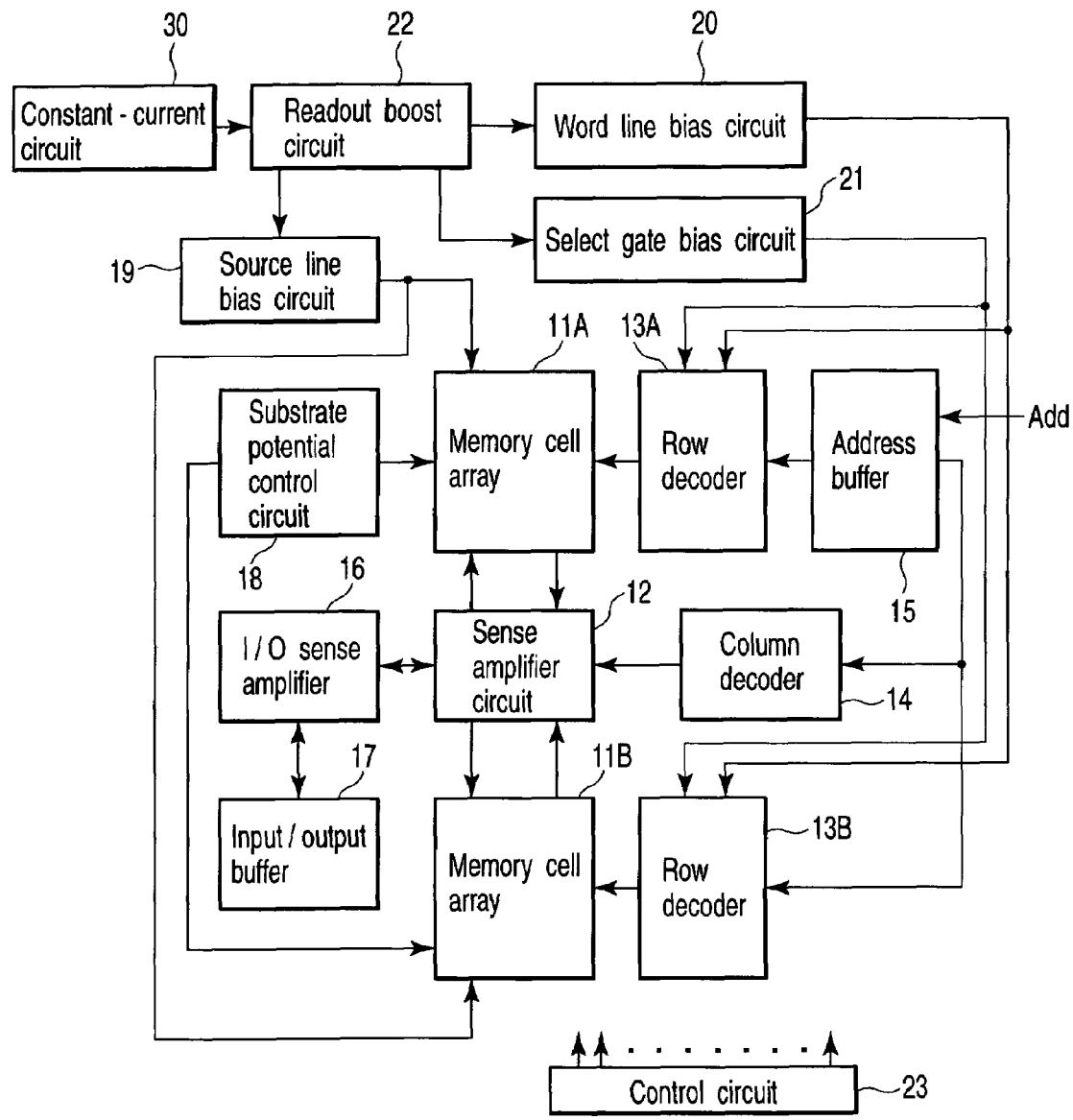
F I G. 1

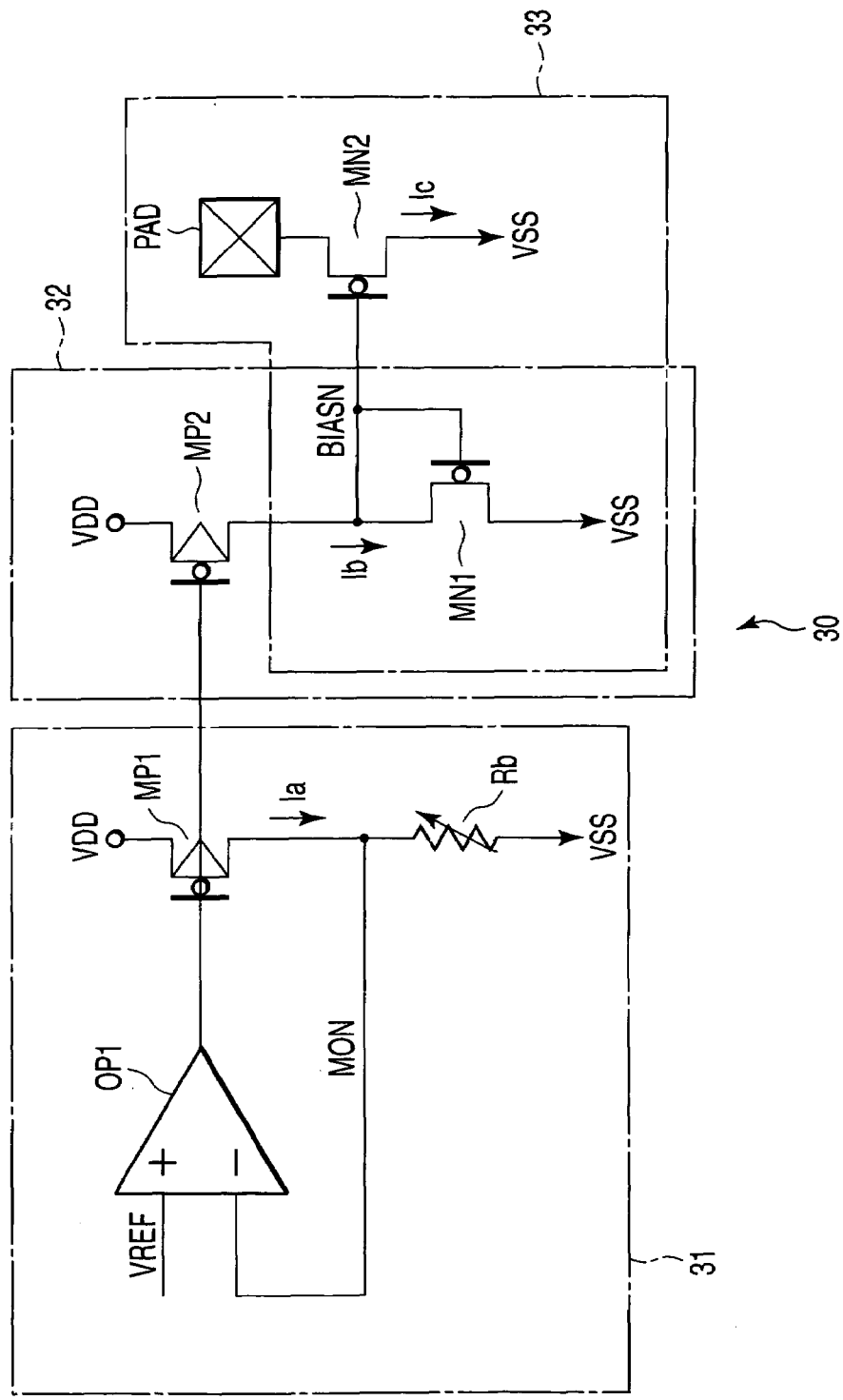
F I G. 2

FIG. 6A  Xo

FIG. 6B  BIASN

FIG. 6C  VREFSHFT

FIG. 6D  trimout

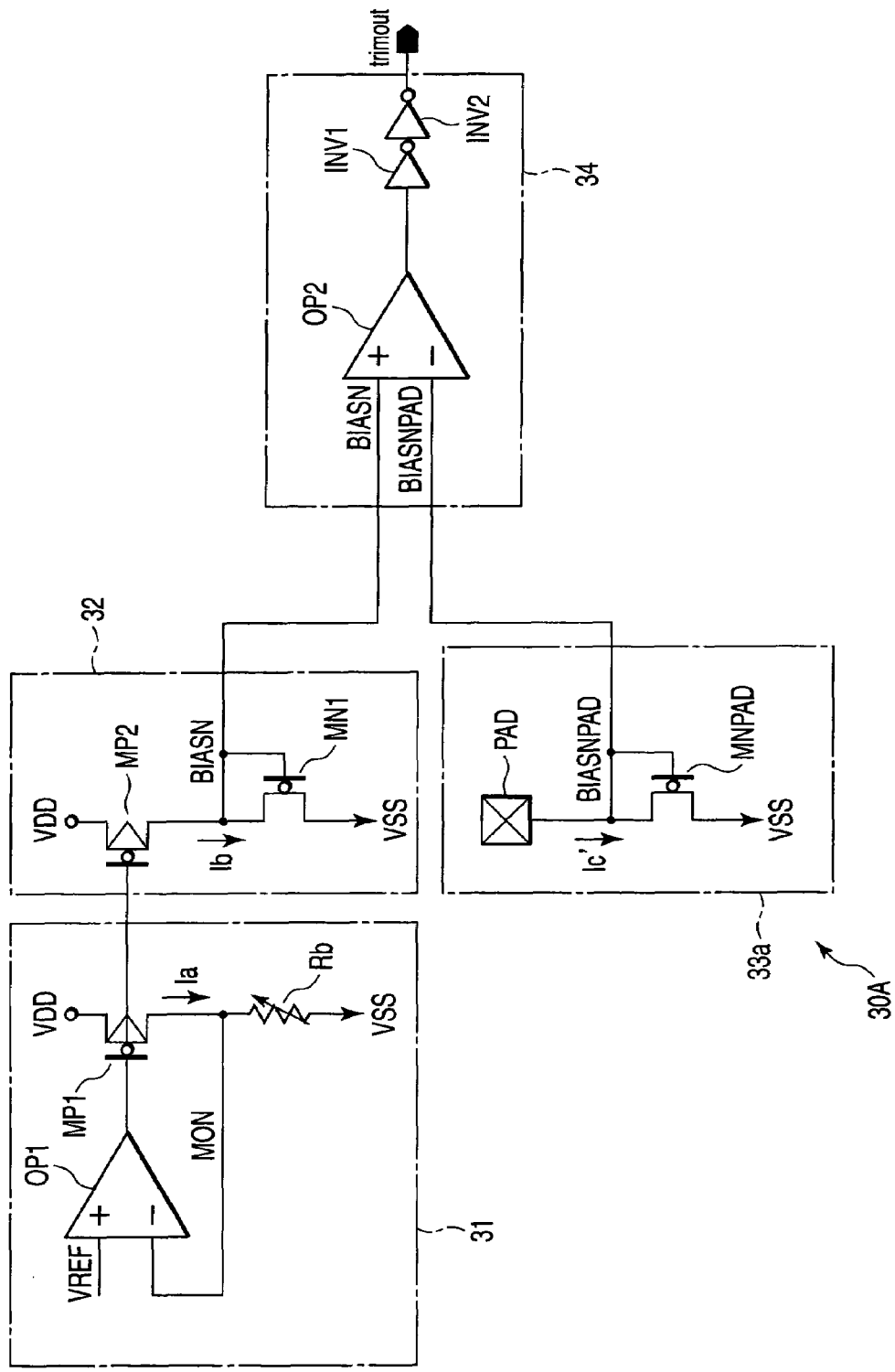
F I G. 4

SEMICONDUCTOR MEMORY DEVICE PROVIDED WITH CONSTANT-CURRENT CIRCUIT HAVING CURRENT TRIMMING FUNCTION

CROSS-REFERENCE TO RELATED APPLICATIONS

This application is based upon and claims the benefit of priority from prior Japanese Patent Application No. 2004-080813, filed Mar. 19, 2004, the entire contents of which are incorporated herein by reference.

BACKGROUND OF THE INVENTION

1. Field of the Invention

The present invention relates to a semiconductor memory device. More particularly, the present invention relates to a NAND cell type of electrically erasable programmable read only memory (EEPROM) which is provided with a constant-current circuit having a current trimming function and suitable for use in a power supply circuit or the like.

2. Description of the Related Art

Conventionally, a NAND cell type of EEPROM is well known as a nonvolatile semiconductor memory device (see, for example, Jpn. Pat. Appln. KOKAI Publication No. 10-275481). A voltage-to-current conversion circuit is usually used in the power supply circuit of a NAND cell type of EEPROM.

In recent years, attention has been paid to a constant-current circuit having a current trimming function as the voltage-to-current conversion circuit (see, for example, Jpn. Pat. Appln. KOKAI Publication No. 11-346127). Application of such a constant-current circuit to the power supply circuit of a semiconductor memory device has also been examined.

Although application of a constant-current circuit having a current trimming function to the power supply circuit of a NAND cell type of EEPROM has also been considered, however, it has not yet been put to practical use.

BRIEF SUMMARY OF THE INVENTION

According to a first aspect of the present invention, there is provided a semiconductor memory device comprising: a memory cell unit including at least one semiconductor memory cell; a voltage generating circuit which produces an operating voltage to which reference is made in performing a predetermined operation on the memory cell unit; and a constant-current circuit capable of a current trimming operation and adapted to supply a constant current to the voltage generating circuit.

BRIEF DESCRIPTION OF THE SEVERAL VIEWS OF DRAWING

FIG. 1 is a block diagram of a NAND cell type of EEPROM in accordance with a first embodiment of the present invention;

FIG. 2 is a circuit diagram of the constant-current circuit having a current trimming function and applied to the readout boost circuit of the NAND cell type of EEPROM of FIG. 1;

FIG. 4 is a circuit diagram of a constant-current circuit having a current trimming function in accordance with a second embodiment of the present invention;

FIGS. 6A to 6D are diagrams for use in explanation of automatic testing of the constant-current circuit of FIG. 5;

DETAILED DESCRIPTION OF THE INVENTION

Figure 3:
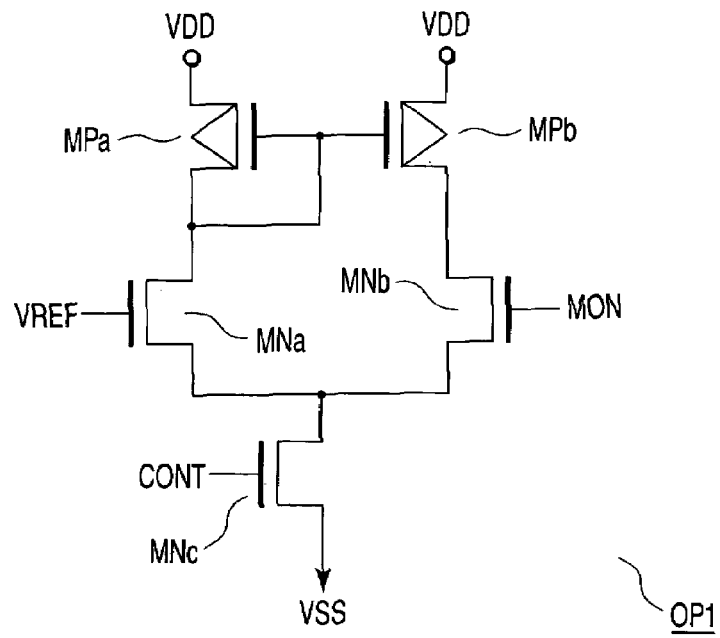
FIG. 3 shows a circuit arrangement of the operational amplifier used in the constant-current circuit of FIG. 2.

Embodiments of the present invention will be described with reference to the accompanying drawings.

[First Embodiment]

FIG. 1 shows the basic arrangement of a NAND cell type of EEPROM (semiconductor memory device) in accordance with a first embodiment of the present invention. Application of a constant-current circuit having a current trimming function to a readout boost circuit adapted to generate a boosted voltage higher than a supply voltage (VCC) as an example of a power supply circuit (voltage generating circuit) will be described herein.

For example, in each of memory cell arrays 11A and 11B as memory cell units, NAND cells (semiconductor memory cells) are arranged in rows and columns. These memory cell arrays 11A and 11B are each of open bit line type. Therefore, a sense amplifier circuit 12 adapted to write or read data is located between the memory cell arrays 11A and 11B. This sense amplifier circuit 12 doubles as a latch circuit. The sense amplifier circuit 12 is connected to the bit lines of the respective memory cell arrays 11A and 11B.

Row decoders 13A and 13B are connected to the memory cell arrays 11A and 11B, respectively. A column decoder 14 is connected to the sense amplifier circuit 12. An address buffer 15 adapted to hold an address signal Add is connected to the row decoders 13A and 13B and the column decoder 14. The row decoders 13A and 13B select a word line and select gate according to the address signal Add supplied from the address buffer 15. The column decoder 14 selects a bit line according to the address signal Add from the address buffer 15.

To the sense amplifier circuit 12 is connected an I/O sense amplifier 16 adapted to amplify input/output data. To the I/O sense amplifier 16 is connected an input/output buffer 17 adapted to receive or transmit data between the chip and outside. To the memory cell arrays 11A and 11B are connected a substrate potential control circuit 18 adapted to control a substrate potential and a source line bias circuit 19 adapted to apply a potential to their source lines. The source line bias circuit 19 connects the source lines to ground at data read time and at verify read time and sets the source lines to a write non-select potential at data write time.

To the row decoders 13A and 13B is connected a word line bias circuit 20 adapted to apply a potential to the word lines and a select gate bias circuit 21 adapted to apply a potential to select gates. A readout boost circuit 22 as a voltage generating circuit is connected to the source line bias circuit 19, the word line bias circuit 20, and the select gate bias circuit 21. The readout boost circuit 22 is provided with a constant-current circuit 30 having a current trimming function. Based on an output (constant current) of the constant-current circuit 30, the readout boost circuit 22 generates boosted voltages (for example, 4.5 V and 6 V) higher than the supply voltage VCC which are to be applied to select gates and control gates at data read time and at verify read time. That is, at data read time and at verify read time, the boosted voltage is applied to the word line bias circuit 20 and the select gate bias circuit 21. At data write time, the boosted voltage is applied to the source line bias circuit 19.

A control circuit 23 controls the source line bias circuit 19, the select gate bias circuit 21, the readout boost circuit 22, the substrate potential control circuit 18, and so on, thereby implementing given operations of writing, reading, verifying, and erasing data.

FIG. 2 shows the basic arrangement of the constant-current circuit 30 having the current trimming function. In this embodiment, the constant-current circuit 30 is composed, as shown in FIG. 2, of a current source generating circuit unit 31, a current conversion circuit unit 32, and a current measurement circuit unit 33.

The current source generating circuit unit 31 is composed of an operational amplifier OP1 and a feedback circuit consisting of a p-channel MOS (Metal Oxide Semiconductor) transistor MP1 and a variable resistor Rb. The operational amplifier OP1 has its noninverting input terminal (+) connected to receive a reference voltage VREF from a constant-voltage source (not shown) of, say, 1.2 V and its inverting input terminal (−) supplied with a monitor voltage MON which will be described later. The operational amplifier OP1 has its output connected to the gate of the p-channel MOS transistor MP1. That is, the operational amplifier OP1 controls the gate voltage of the p-channel MOS transistor MP1 so that the reference voltage VREF and the monitor voltage MON become equal to each other. The operational amplifier OP1 may be constructed, as shown in FIG. 3, from transistor pairs (in this case, p-channel MOS transistors MPa and MPb and n-channel MOS transistors MNa and MNb) and an n-channel MOS transistor MNc. This circuit arrangement is well known.

In FIG. 2, the p-channel MOS transistor MP1 has its source connected to the supply voltage VDD and its drain connected to one end of the variable resistor Rb. The connection point of the p-channel MOS transistor MP1 and the variable resistor Rb is connected to the inverting input terminal of the operational amplifier OP1. That is, the operational amplifier OP1 is supplied, as the monitor voltage MON, with the potential on the connection point of the p-channel MOS transistor MP1 and the variable resistor Rb.

The variable resistor Rb includes a resistor (for example, a ladder-type resistor) that it can perform a trimming operation. In other words, difference resistance values of the resistor are assigned to their respective bits and thus the resistance value of the resistor is varied according to the selection of one of the bits. The other end of the variable resistor Rb is connected to ground potential VSS.

Referring back to FIG. 2, the current conversion circuit unit 32 is composed of, for example, a p-channel MOS transistor MP2 connected with the p-channel MOS transistor MP1 in current mirror configuration and a diode-connected n-channel MOS transistor MN1 connected to the transistor MP2. More specifically, the p-channel MOS transistor MP2 has its source connected to the supply voltage VDD and its drain connected to the gate and drain of the diode-connected n-channel MOS transistor MN1. The source of the n-channel MOS transistor MN1 is connected to ground potential VSS.

The current measurement circuit unit 33 is constructed from the n-channel MOS transistor MN1, an n-channel MOS transistor MN2 connected to the n-channel MOS transistor MN1 in current mirror configuration, and an external pad PAD used to control a current (Ic) flowing in the n-channel MOS transistor MN2 from the outside of the chip. More specifically, the n-channel MOS transistor MN2 has its gate connected to the drain of the p-channel MOS transistor MP2 and the gate and drain of the n-channel MOS transistor MN1 adapted for diode operation. The n-channel MOS transistor MN2 has its drain connected to the external pad PAD and its source connected to ground potential VSS.

In the constant-current circuit 30 thus arranged, the current Ia flowing through the p-channel MOS transistor MP1 is given by $$MON/Rb = VREF/Rb$$

where Rb is the resistance value of the variable resistor Rb.

Suppose, for example, that the ratio (L/W) of the gate length (L) of the p-channel MOS transistor MP2 to its gate width (W) is set equal to that of the p-channel MOS transistor MP1. Then, the current Ia is mirrored by the p-channel MOS transistor MP2. Thus, the current Ib flowing through the p-channel MOS transistor MP2 and the n-channel MOS transistor MN1 will also become REF/Rb.

Suppose that the ratio (L/W) of the gate length of the n-cannel MOS transistor MN1 to its gate width is set equal to that of the p-channel MOS transistors MP1 and MP2. Then, the gate voltage of the n-channel MOS transistor MN1, i.e., bias node (BIASN), becomes the bias voltage that allows a current Ib of VREF/Rb to flow through the transistor MN1.

The variable resistor Rb is usually subject to variations in resistance. In addition, the transistors MPa, MPb and the transistors MNa, MNb forming the operational amplifier OP1 and the current-mirror-connected p-channel MOS transistors MP1 and MP2 are normally subject to variations in threshold voltage. For this reason, there is no guarantee that the bias node (BIASN) will inevitably become the bias voltage that allows the current Ib of VREF/Rb to flow through the transistor MN1. That is, there is some reduction in accuracy of the constant current due to variations in resistance of the variable resistor Rb, variations in threshold voltage of the transistors forming the operational amplifier OP1, and variations in threshold voltage of the current-mirror transistors.

Accordingly, as a test for improving the constant-current accuracy, a desired voltage is applied to the drain of the n-channel MOS transistor MN2 through the external pad PAD with the bias voltage BIASN uses as the gate voltage of the n-channel MOS transistor MN2. The value of the current Ic flowing through the n-channel MOS transistor MN2 is then measured. The resistance of the variable resistor Rb is changed in accordance with the measured value. That is, the resistance value of the variable resistor Rb is changed so that the value of the current Ic becomes a value (constant current) to be set by the desired voltage. The measurement of the current Ic is repeated each time the resistance value of the variable resistor Rb is trimmed. It thus becomes possible to guarantee the bias node (BIASN) to be the bias voltage that allows the current Ib of VREF/Rb to flow through the transistor MN1.

With this test method, since the current value is measured directly, the constant-current accuracy is very high. The accuracy of the constant current can be increased without being affected by the variations in resistance of the variable resistor Rb, the variations in threshold voltage of the transistors forming the operational amplifier OP1, and the variations in threshold voltage of the current-mirror transistors. Therefore, the provision of the constant-current circuit 30 in the readout boost circuit 22 allows the accuracy of the output (boosted voltage) of the readout boost circuit 22 to be increased. As the result, the reliability of the NAND-cell type of EEPROM can be increased.

[Second Embodiment]

FIG. 4 shows the basic arrangement of a constant-current circuit 30A having the current trimming function in accordance with a second embodiment of the present invention. The constant-current circuit 30A to be described here is arranged to allow for automatic testing. In FIG. 4, corresponding parts to those in FIG. 2 are denoted by like reference numerals and detailed descriptions thereof are omitted.

In this embodiment, the constant-current circuit 30A is comprised of the current source generating circuit unit 31, the current conversion circuit unit 32, a current measurement circuit unit 33a, and a comparison circuit unit 34. The current source generating circuit unit 31 is composed, as in the case of FIG. 2, of the operational amplifier (first operational amplifier) OP1 and the feedback circuit consisting of the p-channel MOS (Metal Oxide Semiconductor) transistor MP1 and the variable resistor Rb. The current conversion circuit unit 32 is composed, as in the case of FIG. 2, of the p-channel MOS transistor MP2 connected with the p-channel MOS transistor MP1 in current mirror configuration and the diode-connected n-channel MOS transistor MN1 connected to the transistor MP2.

The current measurement circuit unit 33a is composed, as shown in FIG. 4, of a diode-connected n-channel MOS transistor MNPAD and an external pad PAD used to externally control a current Ic' flowing through the n-channel MOS transistor MNPAD.

More specifically, the n-channel MOS transistor MNPAD has its gate and drain connected together to the external pad PAD and its source connected to ground potential VSS. The current measurement circuit unit 33a provides a bias voltage (second bias voltage) BIASNPAD, which is the one produced when a desired voltage is applied to the external pad PAD and consequently the current Ic' flowing through the n-channel MOS transistor MNPAD becomes a value to be set by the desired voltage.

The comparison circuit unit 34 is composed of, for example, an operational amplifier (second operational amplifier) OP2 and first and second inverter circuits INV1 and INV2. The operational amplifier OP2 has its noninverting input terminal connected to the connection point of the drain of the p-channel MOS transistor MP2 and the gate and drain of the n-channel MOS transistor MN1 in the current conversion circuit unit 32. Thus, the operational amplifier OP2 is supplied at its noninverting input terminal with the bias voltage (first bias voltage) BIASN produced by the current conversion circuit unit 32. On the other hand, the inverting input terminal of the operational amplifier OP2 is connected to the connection point of the external pad PAD and the gate and drain of the n-channel MOS transistor MNPAD in the current measurement circuit unit 33a. Thus, the operational amplifier OP2 is supplied at its inverting input terminal with the bias voltage BIASNPAD appearing at the gate and drain of the n-channel MOS transistor MNPAD in the current measurement circuit unit 33a. The operational amplifier OP2 has its output connected to a series combination of the first and second inverter circuits INV1 and INV2. The output of the inverter circuit INV2 is taken out as the output, trimout, of the comparison circuit unit 34. The operational amplifier OP2 may be configured in the same way as the operational amplifier OP1 shown in FIG. 3.

Next, a description is given of a test for improving the constant-current accuracy in the constant-current circuit arranged as described above. First, a desired voltage is applied to the drain of the n-channel MOS transistor MNPAD via the external pad PAD. A comparison is then made in the operational amplifier OP2 between the bias voltage BIASNPAD produced by the current measurement circuit unit 33a and the bias voltage BIASN produced by the current conversion circuit unit 32. At this point, the resistance of the variable resistor Rb of the current source generating circuit unit 31 is varied in increments of one bit. First, the resistance of the variable resistor Rb is incremented from bit 0 to bit 1. A check is performed on the output, trimout, of the comparison circuit unit 34 at this point. If the output, trimout, of the comparison circuit unit 34 remains unchanged, then the resistance of the variable resistor Rb is incremented from bit 1 to bit 2. A check is then performed on the output, trimout, of the comparison circuit unit 34 at this point. By changing the resistance of the variable resistor Rb in this manner, the output, trimout, of the comparison circuit unit 34 will be inverted at the time when the bias voltage BIASN and the bias voltage BIASNPAD become equal to each other. At this point, the current Ic' flowing through the n-channel MOS transistor MNPAD is supposed to have reached the set value; thus, the trimming value (resistance) of the variable resistor Rb is latched. It therefore becomes possible to guarantee the bias node (BIASN) to be the bias voltage that causes the current Ib of VREF/Rb to flow through the transistor MN1.

This testing method allows the resistance of the variable resistor Rb to be automatically controlled in accordance with the output, trimout, of the comparison circuit unit 34. Accordingly, with the NAND-cell type of EEPROM in which the constant-current circuit 30A arranged as described above is provided in the readout boost circuit 22, the constant-current automatic testing makes it possible to reduce the test time.

[Third Embodiment]

Figure 5:
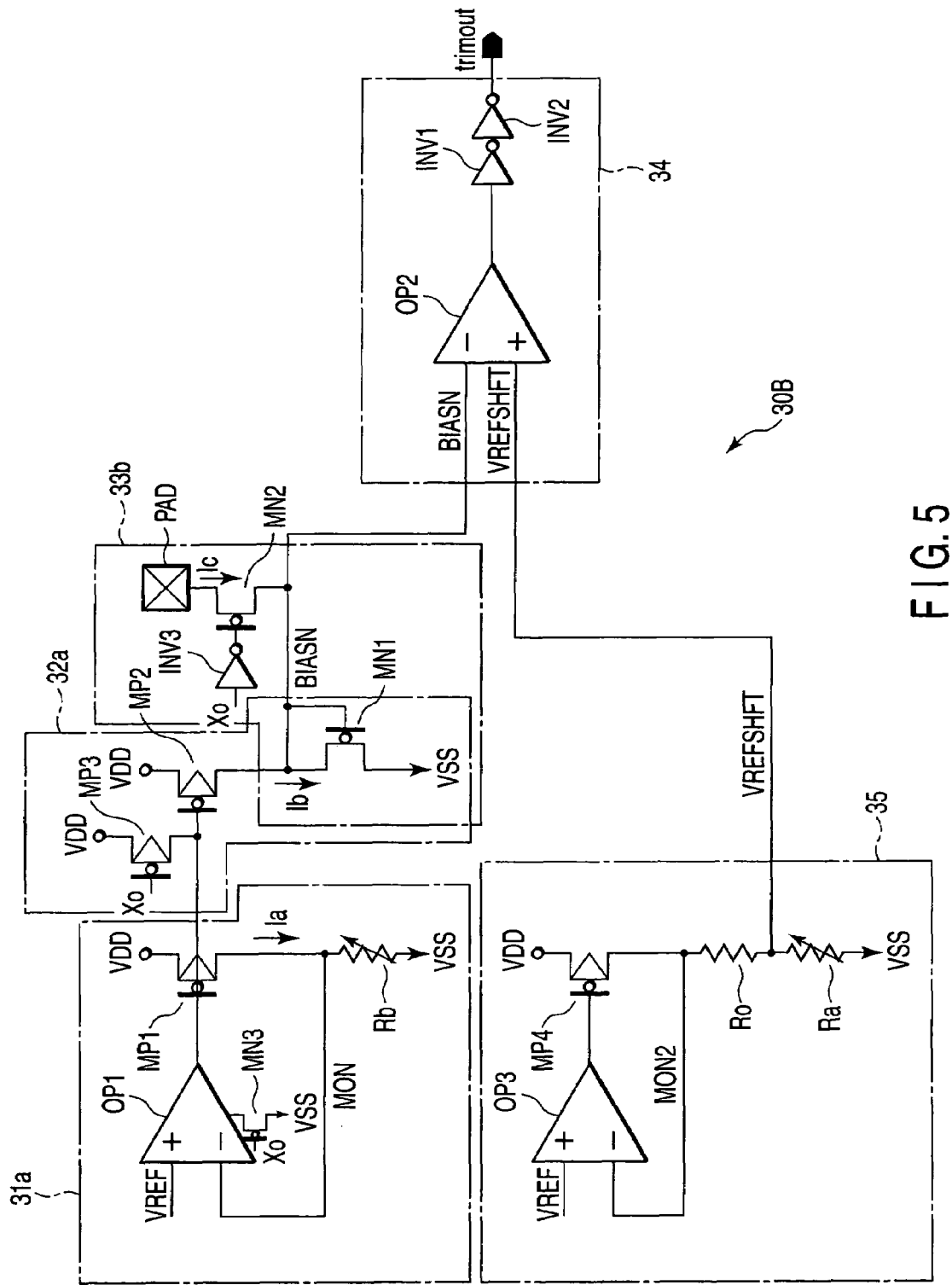
FIG. 5 is a circuit diagram of a constant-current circuit having a current trimming function in accordance with a third embodiment of the present invention.

FIG. 5 shows the basic arrangement of a constant-current circuit 30B having the current trimming function in accordance with a third embodiment of the present invention. The constant-current circuit 30B to be described here is arranged to allow for automatic testing. In FIG. 5, corresponding parts to those in FIG. 4 are denoted by like reference numerals and detailed descriptions thereof are omitted.

In this embodiment, the constant-current circuit 30B is comprised of a current source generating circuit unit 31a, a current conversion circuit unit 32a, a current measurement circuit unit 33b, the comparison circuit unit 34, and a voltage shift circuit unit 35. The current source generating circuit unit 31a is composed of the operational amplifier (first operational amplifier) OP1 and a first feedback circuit consisting of the p-channel MOS transistor MP1 and the variable resistor (first variable resistor) Rb. The operational amplifier OP1 is provided with an n-channel MOS transistor (first control circuit) MN3, which is responsive to application of a control signal Xo to its gate to control the amplifying operation of the operational amplifier OP1. For example, when the control signal Xo goes to a high level, the n-channel MOS transistor MN3 causes the operational amplifier OP1 to go into the operating state.

The current conversion circuit unit 32a is composed of the p-channel MOS transistor MP2 current-mirror connected with the p-channel MOS transistor MP1 and the diode-connected n-channel MOS transistor MN1 connected to the transistor MP2. To the gate of the p-channel MOS transistor MP2 is connected a p-channel MOS transistor (second control circuit) MP3. More specifically, the p-channel MOS transistor MP3 has its drain connected to the gate of the p-channel MOS transistor MP2, its source connected to the supply voltage VDD, and its gate connected to receive the aforementioned control signal Xo.

The current measurement circuit unit 33b is composed of the n-channel MOS transistor MN1, the n-channel MOS transistor MN2 connected to the bias node (BIASN) of the n-channel MOS transistor MN1, and the external pad PAD used to control the current (Ic) flowing through the n-channel MOS transistor MN2 from the outside of the chip. The n-channel MOS transistor MN2 has its gate connected to receive the control signal Xo via an inverter circuit (third control circuit) INV3.

The comparison circuit unit 34 is composed of the operational amplifier (third operational amplifier) OP2 and the first and second inverter circuits INV1 and INV2. More specifically, the operational amplifier OP2 has its inverting input terminal connected to receive the bias voltage BIASN produced by the current measurement circuit unit 33b and its noninverting input terminal connected to receive a shift voltage VREFSHFT produced by the voltage shift circuit unit 35.

The voltage shift circuit unit 35 is constructed from an operational amplifier (second operational amplifier) OP3 and a second feedback circuit composed of a p-channel MOS transistor MP4, a resistor Ro, and a variable resistor (second variable resistor) Ra. The operational amplifier OP3 has its noninverting input terminal connected to receive a reference voltage VREF from a source of a constant voltage of 1.2 V (not shown) and its inverting input terminal connected to receive a second monitor voltage MON2 which will be described later. The output terminal of the operational amplifier OP3 is connected to the gate of the p-channel MOS transistor MP4. That is, the operational amplifier OP3 controls the gate voltage of the p-channel MOS transistor MP4 so that the reference voltage VREF and the second monitor voltage MON2 become equal to each other. The operational amplifier OP3 may be configured identically to the operational amplifier OP1 shown in FIG. 3.

The source of the p-channel MOS transistor MP4 is connected to the supply voltage VDD. The drain of the p-channel MOS transistor MP4 is connected to one end of the variable resistor Ra through the resistor Ro. The inverting input terminal of the operational amplifier OP3 is connected to the connection point of the drain of the p-channel MOS transistor MP4 and the resistor Ro. That is, as the second monitor voltage MON2, the potential on the connection point of the drain of the p-channel MOS transistor MP4 and the resistor Ro is applied to the inverting input terminal of the operational amplifier OP3.

The connection point of the resistor Ro and the variable resistor Ra is connected to the noninverting input terminal of the operational amplifier OP2 in the comparison circuit unit 34. That is, the potential on the connection point of the resistor Ro and the variable resistor Ra (in this case, the voltage obtained by shifting the reference voltage VREF by an amount corresponding to the ratio of the resistor Ro and the variable resistor Ra) is applied as the shift voltage VREFSHFT to the noninverting input terminal of the operational amplifier OP2 in the comparison circuit unit 34. Like the variable resistor Rb in the current source generating circuit unit 31a, the variable resistor Ra is comprised of a resistor (for example, a ladder-type resistor) such that its resistance value can be varied according to the selection of bits. The other end of this variable resistor Ra is connected to ground potential VSS.

Next, a description is given of a test made to improve the constant-current accuracy in the constant-current circuit arranged as described above. More specifically, a description is given of an automatic testing method which is not affected by variations in resistance of the variable resistors Ra and Rb, variations in threshold voltage of the paired transistors forming the operational amplifiers OP1, OP2 and OP3, and variations in threshold voltage of the current-mirror-connected transistors.

As shown in FIG. 6, first, the control signal Xo is set at a low level. A desired voltage is then applied to the drain of the n-channel MOS transistor MN2 through the external pad PAD. As the result, a current Ib will flow through the n-channel MOS transistor MN1 via the n-channel MOS transistor MN2. At this point, the n-channel MOS transistor MN3 is OFF, the p-channel MOS transistor MP3 is ON, and the n-channel MOS transistor MN2 is ON. Thus, no current will flow in the current path that connects the p-channel MOS transistors MP1 and MP2 together. Thereby, a bias voltage BIASN is obtained which is such as to allow the current Ic flowing through the n-channel MOS transistor MN2 to have a value (constant current) to be set by the desired voltage applied to the external pad PAD.

A comparison is next made in the operational amplifier OP2 between the bias voltage BIASN produced by the current measurement circuit unit 33b and the shifted voltage VREFSHFT produced by the voltage shift circuit unit 35. The resistance of the variable resistor Ra is determined so that the shifted voltage VREFSHFT becomes equal to the bias voltage BIASN. At this point, the resistance of the variable resistor Ra is incremented from bit 0 to bit 1 and then the output, trimout, of the comparison circuit unit 34 is checked. If the output, trimout, of the comparison circuit unit 34 remains unchanged, then the resistance of the variable resistor Ra is further incremented from bit 1 to bit 2. The output, trimout, of the comparison circuit unit 34 is then checked. As the result of changing the resistance of the variable resistor Ra in this way, the output, trimout, of the comparison circuit unit 34 will be inverted at the time when the bias voltage BIASN and the shifted voltage VREFSHFT become equal to each other. The trimming value (resistance) of the variable resistor Ra at this time is latched.

Next, the control signal Xo is changed from the low level to a high level. As the result, the n-channel MOS transistor MN3 is turned ON, the p-channel MOS transistor MP3 is turned OFF, and the n-channel MOS transistor MN2 it turned OFF. Thus, the current path between the external pad PAD and the n-channel MOS transistor MN1 is interrupted. On the other hand, the operational amplifier OP1 in the current source generating circuit unit 31a is caused to operate, allowing the current Ib to flow through the n-channel MOS transistor MN1 via the current path between the p-channel MOS transistors MP1 and MP2.

The resistance of the variable resistor Rb is next determined with the trimming value of the variable resistor Ra latched. That is, a comparison is made in the operational amplifier OP2 between the bias voltage BIASN produced by the current measurement circuit unit 33b and the shifted voltage VREFSHFT produced by the voltage shift circuit unit 35. The resistance of the variable resistor Rb is determined so that the bias voltage BIASN becomes equal to the shifted voltage VREFSHFT. At this point, the resistance of the variable resistor Rb is incremented from bit 0 to bit 1 and then the output, trimout, of the comparison circuit unit 34 is checked. If the output, trimout, of the comparison circuit unit 34 remains unchanged, then the resistance of the variable resistor Rb is further incremented from bit 1 to bit 2. The output, trimout, of the comparison circuit unit 34 is then checked. As the result of changing the resistance of the variable resistor Rb in this way, the output, trimout, of the comparison circuit unit 34 will be inverted at the time when the bias voltage BIASN and the shifted voltage VREFSHFT become equal to each other. Since, at this point, the current Ib flowing through the n-channel MOS transistor MN1 is expected to have reached the set value, the trimming value (resistance) of the variable resistor Rb is latched. Thus, it becomes possible to guarantee the bias node (BIASN) to be the bias voltage that allows the current Ib equal to VREF/Rb to flow through the n-channel MOS transistor MN1.

According to this test method, the resistance of the variable resistor Rb can be automatically controlled in accordance with the output, trimout, of the comparison circuit unit 34. Moreover, the n-channel MOS transistor MN1 is used in common in the operation of determining the trimming value of the variable resistor Ra and in the operation of determining the trimming value of the variable resistor Rb. For this reason, variations in the threshold value of the n-channel MOS transistor MN1 will have no effect on these operations. In addition, even in the presence of variations in the resistance of the variable resistors Ra and Rb and variations in the threshold value of the transistors in the operational amplifiers OP2 and OP3, these variations produce the same effect on each of the operations. Therefore, the operations will not be affected by variations in resistance and variations in transistor threshold value.

The constant-current circuit 30B allows the constant-current accuracy to be improved and current trimming adapted for automatic testing to be implemented without being affected by variations in resistance and variations in transistor threshold value.

Accordingly, the NAND-cell type of EEPROM in which the constant-current circuit 30B arranged as described above is provided in the readout boost circuit 22 allows the constant-current automatic testing to be performed in a short period of time and the accuracy of the output (boosted voltage) of the readout boost circuit 22 to be increased. As the result, the reliability of the NAND-cell type of EEPROM can be increased.

Figure 7:
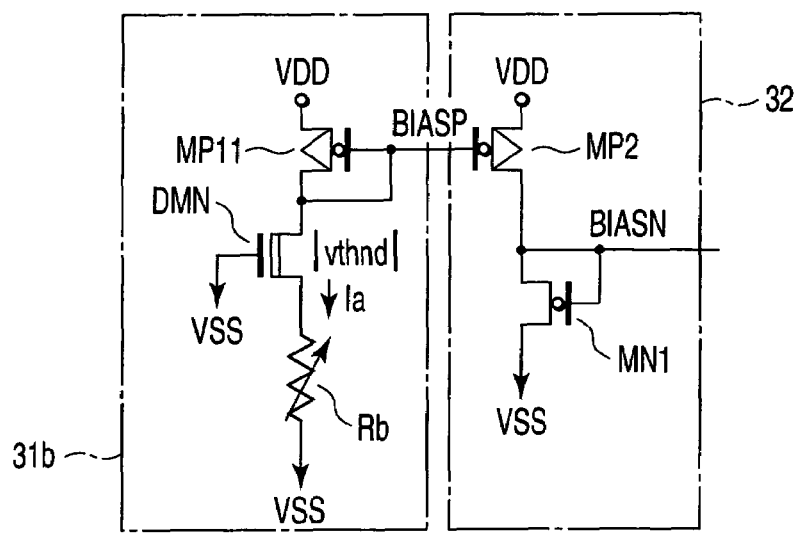
FIG. 7 shows another circuit arrangement of the current source generating circuit unit in the constant-current circuit.

Although, in each of the embodiments described above, the current source generating circuit unit is formed using an operational amplifier, this is not restrictive. For example, the current source generating circuit unit may be configured as shown in FIG. 7. That is, this current source generating circuit unit 31*b* has a diode-connected p-channel MOS transistor MP11, which has its source connected to the supply voltage VDD, its first node (BIASP), i.e., the gate and drain, connected to the drain of a D-type (depletion type) n-channel MOS transistor DMN. The threshold value of the n-channel MOS transistor DMN is set to |vthnd|. The n-channel MOS transistor DMN has its gate connected to ground potential VSS and its source connected to one end of the variable resistor Rb the other end of which is connected to ground potential VSS.

That is, the current source generating circuit unit 31*b* is configured such that a current Ia of |vthnd|/Rb flows through the n-channel MOS transistor DMN. The current source generating circuit unit 31*b* can be formed more simply than it is formed using an operational amplifier.

Figure 8:
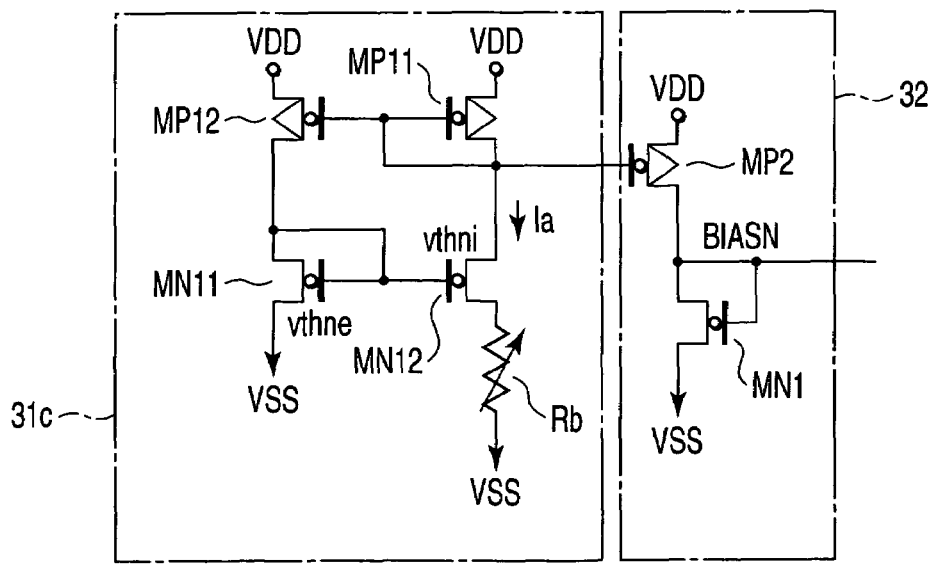
FIG. 8 shows still another circuit arrangement of the current source generating circuit unit in the constant-current circuit.

The current source generating circuit unit can also be arranged as shown in FIG. 8. As shown, the current source generating circuit unit 31*c* has a diode-connected p-channel MOS transistor MP11. The source of this p-channel MOS transistor MP11 is connected to the supply voltage VDD. The first node (gate and drain) of the p-channel MOS transistor MP11 is connected to the gate of a p-channel MOS transistor MP12. The source of the p-channel MOS transistor MP12 is connected to the supply voltage VDD. The first node (drain) of the p-channel MOS transistor MP12 is connected to the first node (gate and drain) of a diode-connected n-channel MOS transistor MN11. In the case of this example, the threshold value of the n-channel MOS transistor MN11 is set to vthne. The source of the n-channel MOS transistor MN11 is connected to ground potential VSS.

The gate and the drain of the n-channel MOS transistor MN11 are connected together to the gate of an n-channel MOS transistor MN12. In this example, the threshold value of the n-channel MOS transistor MN12 is set to vthni (vthne>vthni). The drain of the n-channel MOS transistor MN12 is connected to the drain and gate of the p-channel MOS transistor MP11. The source of the n-channel MOS transistor MN12 is connected to one end of the variable resistor Rb the other end of which is connected to ground potential VSS.

That is, the current source generating circuit unit 31*c* is arranged so that a current Ia of (vthne−vthni)/Rb will flow through the n-channel MOS transistor MN12. The current source generating circuit unit 31*c* is less affected by variations in threshold value due to diffusion of impurities than the current source generating circuit unit 31*b* of FIG. 7 which uses the D-type n-channel MOS transistor DMN.

Figure 9:
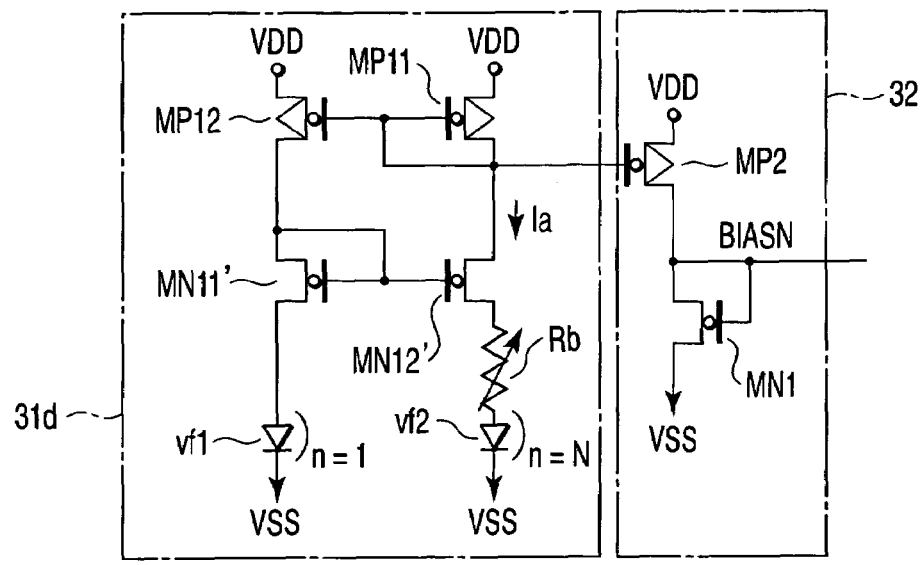
FIG. 9 shows a further circuit arrangement of the current source generating circuit unit in the constant-current circuit.

The current source generating circuit unit can also be arranged as shown in FIG. 9. As shown, the current source generating circuit unit 31*d* has a diode-connected p-channel MOS transistor MP11. The source of this p-channel MOS transistor MP11 is connected to the supply voltage VDD. The first node (gate and drain) of the p-channel MOS transistor MP11 is connected to the gate of a p-channel MOS transistor MP12. The source of the p-channel MOS transistor MP12 is connected to the supply voltage VDD. The first node (drain) of the p-channel MOS transistor MP12 is connected to the first node (gate and drain) of a diode-connected n-channel MOS transistor MN11'. The source of the n-channel MOS transistor MN11' is connected through a forward-biased diode (second diode) vf1 to ground potential VSS.

The gate and the drain of the n-channel MOS transistor MN11' are connected together to the gate of an n-channel MOS transistor MN12'. In this example, the threshold value of the n-channel MOS transistor MN12' is set substantially equal to that of the n-channel MOS transistor MN11'. The drain of the n-channel MOS transistor MN12' is connected to the drain and gate of the p-channel MOS transistor MP11. The source of the n-channel MOS transistor MN12' is connected to one end of the variable resistor Rb the other end of which is connected through a forward-biased diode (first diode) vf2 to ground potential VSS.

That is, the current source generating circuit unit 31*d* is arranged so as to cause a current Ia of $(1/Rb) \cdot (kT/q) \cdot \ln N$ to flow through the n-channel MOS transistor MN12'. Here, $vf1 - vf2 = (kT/q) \cdot \ln N$ and $Rb \cdot I + vf2 = vf1$ where k is the Boltzmann's constant, T is the temperature, and q is the electronic charge.

Although the embodiments of the present invention have been described so far in terms of application of a constant-current circuit having the current trimming function to the readout boost circuit of a NAND cell type of EEPROM, this is not restrictive. The constant-current circuit having the current trimming function may be applied to a word line bias circuit, a select gate bias circuit, a source line bias circuit, a substrate potential control circuit, an I/O sense amplifier, etc.

Figure 10:
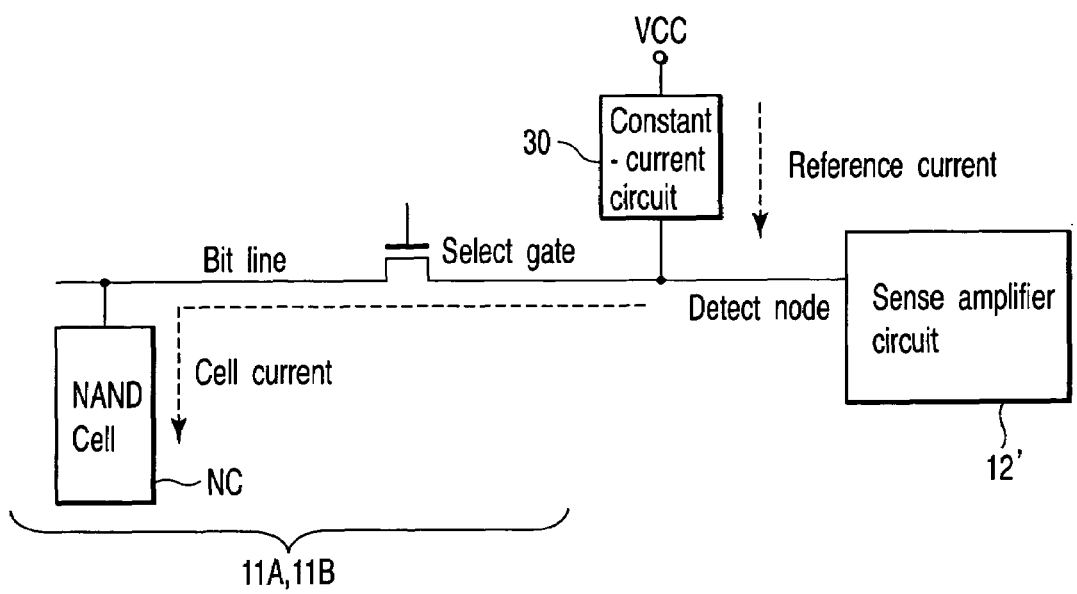
FIG. 10 is a diagram illustrating another application of the constant-current circuit having the current trimming function.

Further, the constant-current circuit may be used, as shown in FIG. 10, as a constant-current circuit 30 used in a memory device which is provided with a sense amplifier circuit 12' that determines whether data stored in a NAND cell NC is a 1 or 0 according to the magnitude relationship of a reference current and a cell current and adapted to produce that reference current.

Additional advantages and modifications will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

What is claimed is:

1. A semiconductor memory device comprising:
   a memory cell unit including at least one semiconductor memory cell;
   a voltage generating circuit which produces an operating voltage to which reference is made in performing a predetermined operation on the memory cell unit; and
   a constant-current circuit capable of a current trimming operation and adapted to supply a constant current to the voltage generating circuit,
   wherein the constant-current circuit comprises:
   a current source generating circuit unit which includes a first variable resistor whose resistance is varied in response to bits being switched; a first p-channel metal oxide semiconductor (MOS) transistor connected in series to the first variable resistor; and a first operational amplifier adapted to control the gate voltage of the first p-channel MOS transistor;
   wherein the constant-current circuit further comprises:
   a current conversion circuit unit which includes a second p-channel MOS transistor connected to the first p-channel MOS transistor in a current mirror configuration, and adapted to mirror the output of the first operational amplifier, and a first n-channel MOS transistor adapted for diode operation and connected in series to the second p-channel MOS transistor; and
   a current measurement circuit unit which includes the first n-channel MOS transistor, a second n-channel MOS transistor connected to the first n-channel MOS transistor in a current mirror configuration, and an external pad to control a current flowing through the second n-channel MOS transistor from the outside of the chip,
   wherein the current trimming operation is to change the resistance of the first variable resistor so that, when a desired voltage is applied to the external pad, the current flowing through the second n-channel MOS transistor may have a value to be set by the desired voltage.

2. A semiconductor memory device according to claim 1, wherein the current source generating circuit unit has a feedback circuit which feeds the potential at the connection point of the first variable resistor and the first p-channel MOS transistor back to the first operational amplifier as a monitor voltage and causes the first operational amplifier to control the gate voltage of the first p-channel MOS transistor in accordance with the difference between the monitor voltage and a reference voltage applied to the first operational amplifier.

3. A semiconductor memory device comprising:
   a memory cell unit including at least one semiconductor memory cell;
   a voltage generating circuit which produces an operating voltage to which reference is made in performing a predetermined operation on the memory cell unit; and
   a constant-current circuit capable of a current trimming operation and adapted to supply a constant current to the voltage generating circuit,
   wherein the constant-current circuit comprises:
   a current source generating circuit unit which includes a first variable resistor whose resistance is varied in response to bits being switched; a first p-channel metal oxide semiconductor (MOS) transistor connected in series to the first variable resistor; and a first operational amplifier adapted to control the gate voltage of the first p-channel MOS transistor;
   wherein the constant-current circuit further comprises:
   a current conversion circuit unit which includes a second p-channel MOS transistor connected to the first p-channel MOS transistor in a current mirror configuration and adapted to mirror the output of the first operational amplifier, and a first n-channel MOS transistor adapted for diode operation and connected in series to the second p-channel MOS transistor to produce a first bias voltage;
   a current measurement circuit unit which includes a second n-channel MOS transistor which is diode-connected and produces a second bias voltage, and an external pad adapted to control a current flowing through the second n-channel MOS transistor from the outside of the chip; and
   a comparison circuit unit including a second operational amplifier adapted to make a comparison between the first bias voltage produced by the current conversion circuit unit and the second bias voltage produced by the current measurement circuit unit,
   wherein the current trimming operation is to change the resistance of the first variable resistor according to the output of the comparison circuit unit so that, when a desired voltage is applied to the external pad, the current flowing through the second n-channel MOS transistor may have a value to be set by the desired voltage.

4. A semiconductor memory device according to claim 3, wherein the current source generating circuit unit has a feedback circuit which feeds the potential at the connection point of the first variable resistor and the first p-channel MOS transistor back to the first operational amplifier as a monitor voltage and causes the first operational amplifier to control the gate voltage of the first p-channel MOS transistor in accordance with the difference between the monitor voltage and a reference voltage applied to the first operational amplifier.

5. A semiconductor memory device comprising:
   a memory cell unit including at least one semiconductor memory cell;
   a voltage generating circuit which produces an operating voltage to which reference is made in performing a predetermined operation on the memory cell unit; and
   a constant-current circuit capable of a current trimming operation and adapted to supply a constant current to the voltage generating circuit, wherein the constant-current circuit comprises:
a current source generating circuit unit which includes a first variable resistor whose resistance is varied in response to bits being switched; a first p-channel metal oxide semiconductor (MOS) transistor connected in series to the first variable resistor; and a first operational amplifier adapted to control the gate voltage of the first p-channel MOS transistor;
wherein the constant-current circuit further comprises:
a current source generating circuit unit which further includes a first control circuit adapted to control the first operational amplifier;
a current conversion circuit unit which includes a second p-channel MOS transistor connected to the first p-channel MOS transistor in a current mirror configuration and adapted to mirror the output of the first operational amplifier, a first n-channel MOS transistor adapted for diode operation and connected in series to the second p-channel MOS transistor, and a second control circuit adapted to control the second p-channel MOS transistor;
a current measurement circuit unit which includes the first n-channel MOS transistor, a second n-channel MOS transistor connected to the bias node of the first n-channel MOS transistor and adapted to produce a bias voltage, an external pad adapted to control a current flowing through the second n-channel MOS transistor from the outside of the chip, and a third control circuit adapted to control the second n-channel MOS transistor;
a voltage shift circuit unit including a second variable resistor whose resistance is varied in response to bits being switched, a resistor connected in series to the second variable resistor to produce a shift voltage, a third p-channel MOS transistor connected in series to the resistor, and a second operational amplifier adapted to control the gate voltage of the third p-channel MOS transistor; and
a comparison circuit unit including a third operational amplifier adapted to make a comparison between the bias voltage produced by the current measurement circuit unit and the shift voltage produced by the voltage shift circuit unit,
wherein the current trimming operation is to change the resistance of the first variable resistor according to the output of the comparison circuit unit so that the bias voltage and the shift voltage become equal to each other by causing the third operational amplifier in the comparison circuit unit to compare the bias voltage obtained when, by applying a desired voltage to the external pad in a state where the first operation amplifier is set off by the first control circuit, the second p-channel MOS transistor is set off by the second control circuit, and the second n-channel MOS transistor is set on by the third control circuit, the current flowing through the first n-channel MOS transistor via the second n-channel MOS transistor has a value to be set by the desired voltage, then holding the resistance of the second variable resistor when the shift voltage is made equal to the bias voltage by changing the resistance of the second variable resistor according to the output of the comparison circuit unit,
and causing the third operational amplifier in the comparison circuit unit to compare the bias voltage produced by the current measurement circuit unit and the shift voltage produced by the voltage shift circuit unit in a state where the first operation amplifier is set on by the first control circuit, the second p-channel MOS transistor is set on by the second control circuit, and the second n-channel MOS transistor is set off by the third control circuit.

6. A semiconductor memory device according to claim 5, wherein the current source generating circuit unit has a first feedback circuit which feeds the potential on the connection point of the first variable resistor and the first p-channel MOS transistor back to the first operational amplifier as a first monitor voltage and causes the first operational amplifier to control the gate voltage of the first p-channel MOS transistor in accordance with the difference between the first monitor voltage and a reference voltage applied to the first operational amplifier, and
the voltage shift circuit unit has a second feedback circuit adapted to apply the potential on the connection point of the resistor and the second variable resistor to the third operational amplifier in the comparison circuit unit as the shift potential, feed the potential on the connection point of the resistor and the third p-channel MOS transistor back to the second operational amplifier as a second monitor voltage, and cause the second operational amplifier to control the gate voltage of the third p-channel MOS transistor in accordance with the difference between the second monitor voltage and the reference voltage.

7. A semiconductor memory device comprising:
a memory cell unit including at least one semiconductor memory cell;
a voltage generating circuit which produces an operating voltage to which reference is made in performing a predetermined operation on the memory cell unit; and
a constant-current circuit capable of a current trimming operation and adapted to supply a constant current to the voltage generating circuit,
wherein the constant-current circuit includes a current source generating circuit unit which includes a variable resistor whose resistance can be varied in response to bits being switched, a first depletion-type n-channel metal oxide semiconductor (MOS) transistor connected in series to the variable resistor, and a first p-channel MOS transistor adapted for diode operation and connected in series to the first depletion-type n-channel MOS transistor.

8. A semiconductor memory device according to claim 7, wherein the first depletion-type n-channel MOS transistor has its gate connected to ground potential.

9. A semiconductor memory device according to claim 7, wherein the constant-current circuit further includes a second p-channel MOS transistor connected to the first p-channel MOS transistor in current mirror configuration, and a second n-channel MOS transistor adapted for diode operation and connected to the second p-channel transistor and the first n-channel MOS transistor.

10. A semiconductor memory device according to claim 9, wherein the first n-channel MOS transistor is lower in threshold value than the second n-channel MOS transistor.

11. A semiconductor memory device comprising:
a memory cell unit including at least one semiconductor memory cell;
a voltage generating circuit which produces an operating voltage to which reference is made in performing a predetermined operation on the memory cell unit; and
a constant-current circuit capable of a current trimming operation and adapted to supply a constant current to the voltage generating circuit, wherein the constant-current circuit includes a current source generating circuit unit which includes a variable resistor whose resistance can be varied in response to bits being switched, a first diode connected in the forward direction to one end of the variable resistor, a first n-channel metal oxide semiconductor (MOS) transistor connected in series to other end of the variable resistor, a first p-channel MOS transistor adapted for diode operation and connected in series to the first n-channel MOS transistor, a second p-channel MOS transistor connected to the first p-channel MOS transistor in current mirror configuration, a second n-channel MOS transistor adapted for diode operation and connected to the second p-channel MOS transistor and the first n-channel MOS transistor, and a second diode connected in the forward direction to the source of the second n-channel MOS transistor.

12. A semiconductor memory device according to claim 11, wherein the first n-channel MOS transistor is equal in threshold value to the second n-channel MOS transistor.

13. A semiconductor memory device comprising:
a memory cell unit including at least one semiconductor memory cell;
a voltage generating circuit which produces an operating voltage to which reference is made in performing a predetermined operation on the memory cell unit; and
a constant-current circuit capable of a current trimming operation and adapted to supply a constant current to the voltage generating circuit,
wherein the constant-current circuit comprises:
a current source generating circuit unit which includes a first variable resistor whose resistance is varied in response to bits being switched; a first p-channel metal oxide semiconductor (MOS) transistor connected in series to the first variable resistor; and a first operational amplifier adapted to control the gate voltage of the first p-channel MOS transistor;
wherein the constant-current circuit comprises:
the current source generating circuit unit which further includes a first control circuit adapted to control the first operational amplifier;
a current conversion circuit unit which includes a second p-channel MOS transistor connected to the first p-channel MOS transistor in a current mirror configuration and adapted to mirror the output of the first operational amplifier, a first n-channel MOS transistor adapted for diode operation and connected in series to the second p-channel MOS transistor, and a second control circuit adapted to control the second p-channel MOS transistor;
a current measurement circuit unit which includes the first n-channel MOS transistor, a second n-channel MOS transistor connected to the bias node of the first n-channel MOS transistor and adapted to produce a bias voltage, an external pad adapted to control a current flowing through the second n-channel MOS transistor from the outside of the chip, and a third control circuit adapted to control the second n-channel MOS transistor;
a voltage shift circuit unit including a second variable resistor whose resistance is varied in response to bits being switched, a resistor connected in series to the second variable resistor to produce a shift voltage, a third p-channel MOS transistor connected in series to the resistor, and a second operational amplifier adapted to control the gate voltage of the third p-channel MOS transistor; and a comparison circuit unit including a third operational amplifier adapted to make a comparison between the bias voltage produced by the current measurement circuit unit and the shift voltage produced by the voltage shift circuit unit,
wherein the current source generating circuit unit has a first feedback circuit adapted to feed the potential on the connection point of the first variable resistor and the first p-channel MOS transistor back to the first operational amplifier as a first monitor voltage and cause the first operational amplifier to control the gate voltage of the first p-channel MOS transistor in accordance with the difference between the first monitor voltage and a reference voltage applied to the first operational amplifier,
and the voltage shift circuit unit has a second feedback circuit adapted to apply the potential on the connection point of the resistor and the second variable resistor to the third operational amplifier in the comparison circuit unit as the shift potential, feed the potential on the connection point of the resistor and the third p-channel MOS transistor back to the second operational amplifier as a second monitor voltage, and cause the second operational amplifier to control the gate voltage of the third p-channel MOS transistor in accordance with the difference between the second monitor voltage and the reference voltage,
wherein the current trimming operation is to change the resistance of the first variable resistor according to the output of the comparison circuit unit so that the bias voltage and the shift voltage become equal to each other by causing the third operational amplifier in the comparison circuit unit to compare the bias voltage obtained when, by applying a desired voltage to the external pad in a state where the first operation amplifier is set off by the first control circuit, the second p-channel MOS transistor is set off by the second control circuit, and the second n-channel MOS transistor is set on by the third control circuit, the current flowing through the first n-channel MOS transistor via the second n-channel MOS transistor has a value to be set by the desired voltage,
then holding the resistance of the second variable resistor when the shift voltage is made equal to the bias voltage by changing the resistance of the second variable resistor according to the output of the comparison circuit unit,
and causing the third operational amplifier in the comparison circuit unit to compare the bias voltage produced by the current measurement circuit unit and the shift voltage produced by the voltage shift circuit unit in a state where the first operation amplifier is set on by the first control circuit, the second p-channel MOS transistor is set on by the second control circuit, and the second n-channel MOS transistor is set off by the third control circuit.

14. A semiconductor memory device comprising:
a memory cell unit including at least one semiconductor memory cell;
a voltage generating circuit which produces an operating voltage to which reference is made in performing a predetermined operation on the memory cell unit; and
a constant-current circuit capable of a current trimming operation and adapted to supply a constant current to the voltage generating circuit,
wherein the constant-current circuit includes a current source generating circuit unit which includes a variable resistor whose resistance can be varied in response to bits being switched, a first depletion-type n-channel metal oxide semiconductor (MOS) transistor connected in series to the variable resistor, and a first p-channel MOS transistor adapted for diode operation and connected in series to the first n-channel MOS transistor, wherein the first depletion-type n-channel MOS transistor has its gate connected to ground potential.

15. A semiconductor memory device comprising:

a memory cell unit including at least one semiconductor memory cell;

a voltage generating circuit which produces an operating voltage to which reference is made in performing a predetermined operation on the memory cell unit; and a constant-current circuit capable of a current trimming operation and adapted to supply a constant current to the voltage generating circuit, wherein the constant-current circuit includes a current source generating circuit unit which includes a variable resistor whose resistance can be varied in response to bits being switched, a first n-channel metal oxide semiconductor (MOS) transistor connected in series to the variable resistor, a first p-channel MOS transistor adapted for diode operation and connected in series to the first n-channel MOS transistor, a second p-channel MOS transistor connected to the first p-channel MOS transistor in current mirror configuration, and a second n-channel MOS transistor adapted for diode operation and connected to the second p-channel transistor and the first n-channel MOS transistor, wherein the first n-channel MOS transistor is lower in threshold value than the second n-channel MOS transistor.

16. A semiconductor memory device comprising:

a memory cell unit including at least one semiconductor memory cell;

a voltage generating circuit which produces an operating voltage to which reference is made in performing a predetermined operation on the memory cell unit; and a constant-current circuit capable of a current trimming operation and adapted to supply a constant current to the voltage generating circuit, wherein the constant-current circuit includes a current source generating circuit unit which includes a variable resistor whose resistance can be varied in response to bits being switched, a first diode connected in the forward direction to one end of the variable resistor, a first n-channel metal oxide semiconductor (MOS) transistor connected in series to other end of the variable resistor, a first p-channel MOS transistor adapted for diode operation and connected in series to the first n-channel MOS transistor, a second p-channel MOS transistor connected to the first p-channel MOS transistor in current mirror configuration, a second n-channel MOS transistor adapted for diode operation and connected to the second p-channel MOS transistor and the first n-channel MOS transistor, and a second diode connected in the forward direction to the source of the second n-channel MOS transistor, wherein the first n-channel MOS transistor is equal in threshold value to the second n-channel MOS transistor.

* * * * *